United States Patent
Kwak et al.

(10) Patent No.: US 7,499,327 B2
(45) Date of Patent: Mar. 3, 2009

(54) NAND FLASH MEMORY DEVICE HAVING PAGE BUFFER ADAPTED TO DISCHARGE BIT LINE VOLTAGE DURING ERASE OPERATION

(75) Inventors: Pan-Suk Kwak, Hwaseong-si (KR); Dae-Seok Byeon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 122 days.

(21) Appl. No.: 11/443,205

(22) Filed: May 31, 2006

(65) Prior Publication Data

US 2006/0274578 A1    Dec. 7, 2006

(30) Foreign Application Priority Data

Jun. 3, 2005    (KR) .................. 10-2005-0047869

(51) Int. Cl.
 *G11C 11/34*    (2006.01)
 *G11C 16/06*    (2006.01)
(52) U.S. Cl. ...................... 365/185.17; 365/185.25; 365/185.29; 365/189.05
(58) Field of Classification Search ............ 365/185.17, 365/185.25, 185.29, 185.33, 189.05
 See application file for complete search history.

(56) References Cited

U.S. PATENT DOCUMENTS

| | | | |
|---|---|---|---|
| 6,278,636 B1 * | 8/2001 | Lee | ................ 365/189.05 |
| 6,353,555 B1 | 3/2002 | Jeong | |
| 6,678,191 B2 * | 1/2004 | Lee et al. | ................ 365/185.17 |
| 6,807,098 B2 | 10/2004 | Jeong et al. | |
| 6,813,214 B2 | 11/2004 | Cho et al. | |
| 6,888,756 B2 * | 5/2005 | Byeon et al. | ............ 365/185.18 |
| 7,173,861 B2 * | 2/2007 | Cho et al. | ............ 365/185.29 |
| 7,190,618 B2 * | 3/2007 | Byeon | ................ 365/185.12 |
| 2001/0050377 A1 * | 12/2001 | Ikehashi et al. | ............ 257/200 |

FOREIGN PATENT DOCUMENTS

| | | |
|---|---|---|
| JP | 2001-006376 | 1/2001 |
| JP | 2002-203393 | 7/2002 |
| JP | 2003-109391 | 4/2003 |
| KR | 101998022229 A | 7/1998 |
| KR | 1020010003221 | 1/2001 |
| KR | 1020020046321 | 6/2002 |
| KR | 1020030006519 | 1/2003 |

* cited by examiner

*Primary Examiner*—Anh Phung
*Assistant Examiner*—Toan Le
(74) *Attorney, Agent, or Firm*—Volentine & Whitt, PLLC

(57) ABSTRACT

A NAND flash memory device includes a memory cell array including a plurality of memory cells, a plurality of page buffers, and an isolation circuit connected between the memory cell array and the plurality of page buffers. The isolation circuit comprises a high voltage transistor adapted to disconnect a first bit line connected to the memory cell array from a second bit line connected to the one of the page buffers during an erase operation of the NAND flash memory device. During the read operation, a third bit line arranged in parallel with the second bit line and connected to one of the page buffers is discharged to prevent the page buffer from being damaged due to coupling capacitance between the second and third bit lines.

18 Claims, 3 Drawing Sheets

NAND FLASH MEMORY DEVICE HAVING PAGE BUFFER ADAPTED TO DISCHARGE BIT LINE VOLTAGE DURING ERASE OPERATION

BACKGROUND OF THE INVENTION

1. Field of the Invention

Embodiments of the present invention relate generally to a NAND flash memory device. More particularly, embodiments of the invention relate to a NAND flash memory device including a page buffer adapted to discharge a bit line voltage that increased due to coupling capacitance during an erase operation.

A claim of priority is made to Korean Patent Application No. 2005-47869, filed Jun. 3, 2005, the disclosure of which is hereby incorporated by reference in its entirety.

2. Discussion of Related Art

A NAND flash memory device typically comprises a memory cell array divided into several memory blocks. Each of the memory blocks generally comprises several cell strings, where each of the cell strings comprises a string selection transistor, a ground selection transistor, and plurality of memory cells serially connected between the string selection transistor and the ground selection transistor. Each of the memory cells comprises a transistor having a source, a drain, a bulk, a floating gate, and a control gate. The NAND flash memory device can perform write and program operations on individual cell strings. However, the NAND flash memory device can only perform an erase operation a memory block unit at a time.

In a NAND flash memory device, a program operation stores a logical '0' in a memory cell by applying a program voltage Vpgm to memory cell's control gate, and causing current to flow between the memory cell's source and drain. Program voltage Vpgm causes electrons in the current to be stored in the memory cell's floating gate, thus increasing a threshold voltage Vth of the memory cell. Increasing threshold voltage Vth of the memory cell causes the memory cell to store a logical '0'. Where the memory cell stores logical '0', it is called a "Programmed Cell".

The NAND flash memory device performs an erase operation to store logical '1' in a block of memory cells. The erase operation is performed by applying an erase voltage "Verase" to the bulk of the memory cells to remove electrons from the memory cells' floating gates. Removing electrons from the memory cells' floating gates reduces their respective threshold voltages. After an erase operation is performed on a block of memory cells, the cells are called "Erased Cell", and each memory cell in the memory block stores a logical '1'. In general, erase voltage Verase is higher than an operating voltage Vcc of the NAND flash memory device. For instance, the erase voltage could be 20V while operating voltage Vcc was only 5V.

FIG. 1 is a cross-sectional view of a cell string in a conventional NAND flash memory. Referring to FIG. 1, a pocket p-type well (Pp-well) is formed with a predetermined depth in a p-type substrate surrounded by an n-type well (N-well). N+ regions doped with N+ impurities are isolated in the pocket p-type well, with channel regions interposed between the N+ regions.

During an erase operation, erase voltage Verase is applied to the pocket p-type well. Where erase voltage Verase is applied to the pocket p-type well, it is also applied to a bit line BL by a P-N junction forward bias. Since erase voltage Verase is generally higher than operating voltage Vcc, transistors connected to bit lines that receive erase voltage Verase must be capable of withstanding a voltage higher than operating voltage Vcc without breaking down. A transistor that does not break down under erase voltage Verase is considered to have "endurance" to erase voltage Verase. Such a transistor is also sometimes called a "High Voltage Transistor".

Erase voltage Verase should not be directly applied to circuits, such as page buffers, that use power voltage Vcc, because doing so may cause transistors in the page buffers to experience breakdown. To prevent transistors in page buffers from receiving erase voltage Verase, NAND flash memory devices commonly include high voltage transistors between a cell array and a page buffer to disconnect the page buffers from erase voltage Verase.

Unfortunately, as the degree of integration in NAND flash memory devices increases, erase voltage Verase can still cause problems in the page buffers due to coupling capacitance between adjacent bit lines. For example, where erase voltage Verase is applied to a first bit line but not a second bit line adjacent to the first bit line, the voltage level of the second bit line may still be elevated due to coupling capacitance between the first and second bit lines. Under these conditions, a first high voltage transistor connected to the first bit line will typically turn off to disconnect the first bit line from a corresponding first page buffer. However, the elevated voltage level of the second bit line can still damage a corresponding second page buffer.

SUMMARY OF THE INVENTION

According to one embodiment of the present invention, a NAND flash memory device comprises a first bit line connected to a memory cell array, an isolation circuit connected between the first bit line and a second bit line to prevent an erase voltage applied to the first bit line from being applied to the second bit line during an erase operation of the NAND flash memory device, and a page buffer connected to the second bit line and adapted to discharge the second bit line during the erase operation.

According to another embodiment of the present invention, a NAND flash memory device comprises a first bit line connected to a memory cell array, a second bit line arranged in parallel with the first bit line, a third bit line arranged in parallel with the first bit line, an isolation circuit connected between the first and third bit lines to prevent an erase voltage applied to the first bit line from being applied to the third bit line during an erase operation, and a page buffer connected to the second bit line and adapted to discharge the second bit line during the erase operation.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
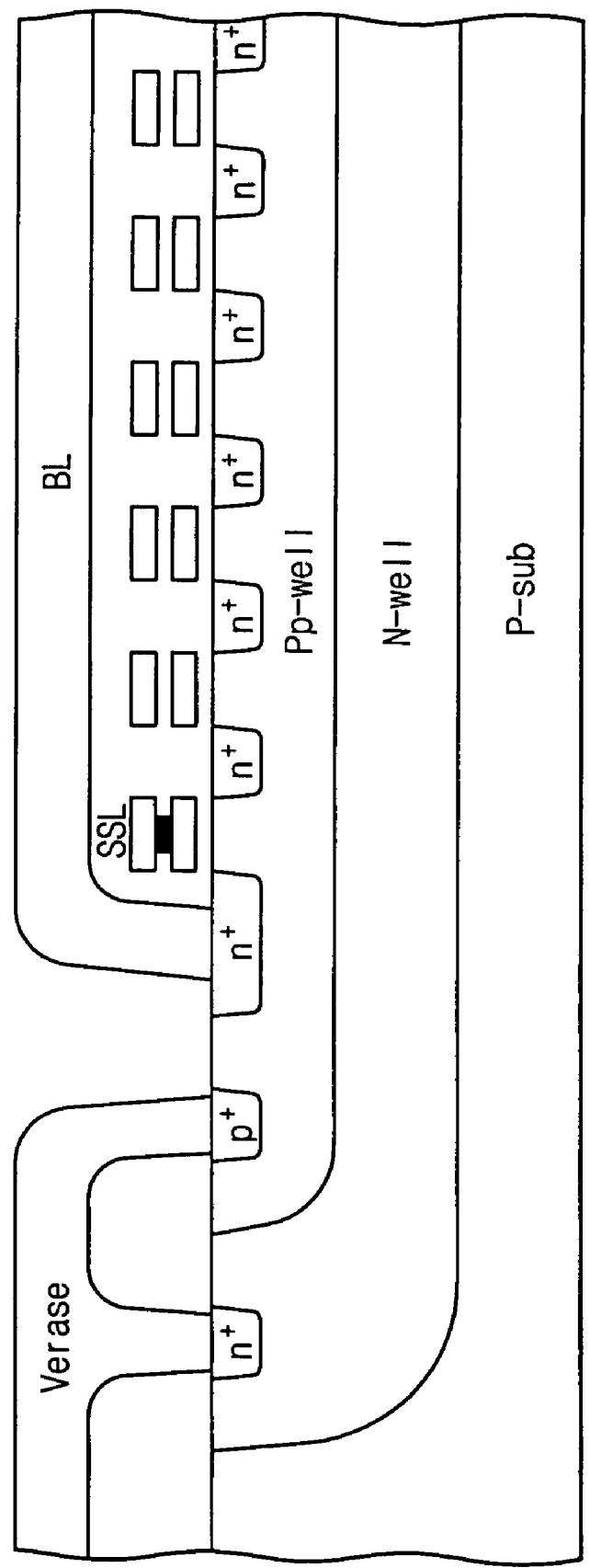
FIG. 1 is a cross-sectional view of a cell string in a conventional NAND flash memory.
Figure 2:
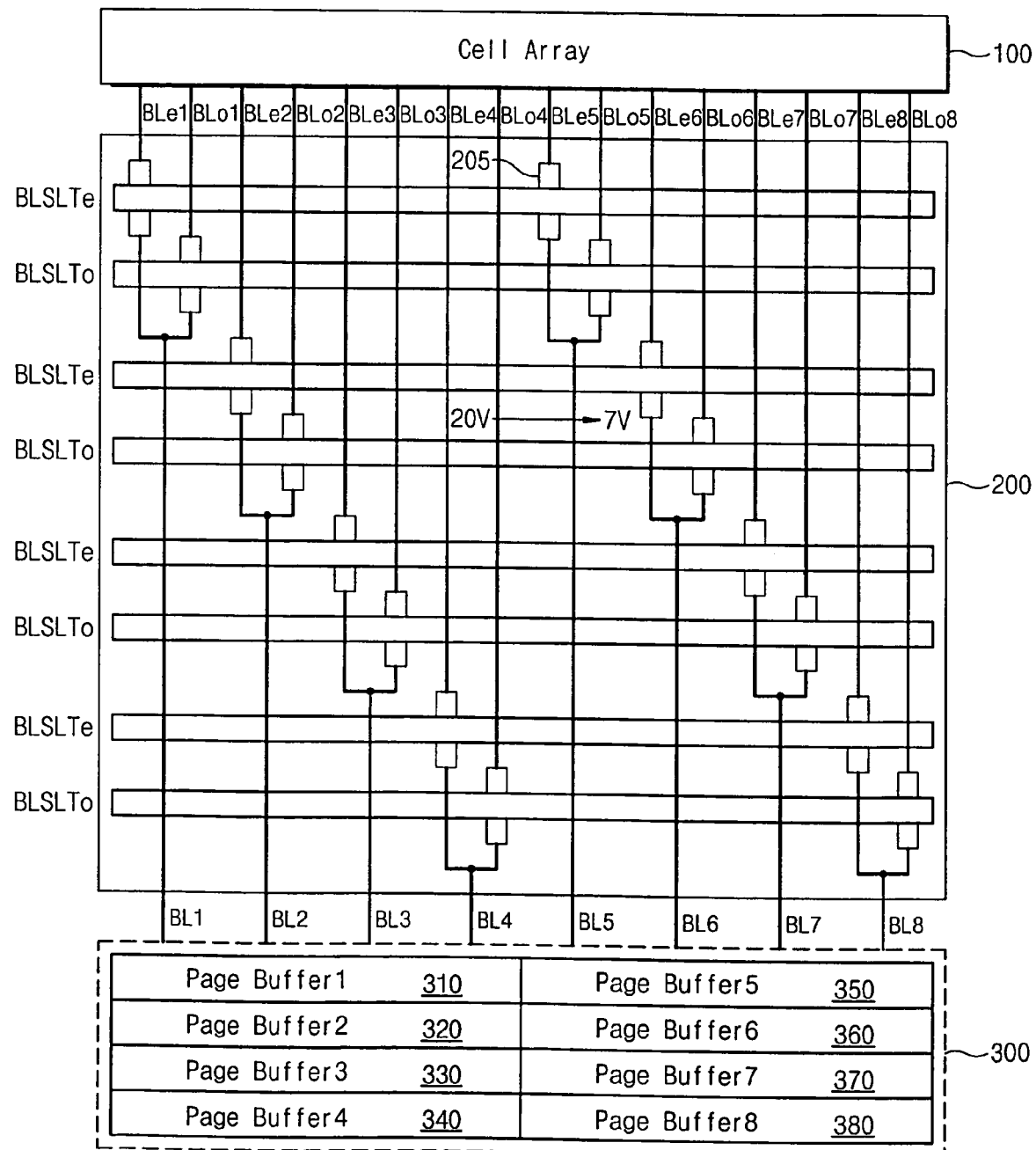
FIG. 2 is a block diagram showing a NAND flash memory according to one embodiment of the present invention.

FIG. 2 is a block diagram of a NAND flash memory device according to one embodiment of the present invention. Referring to FIG. 2, the NAND flash memory device comprises a cell array 100, an isolation circuit 200, and a plurality of page buffers 300. Cell array 100 is connected to isolation circuit 200 by a plurality of bit lines BLe1 through BLe8 and BLo1 through BLo8. Bit lines BLe1 through BLe8 and BLo1 through BLo8 are arranged in bit line pairs BLe1 and BLo1, BLe2 and BLo2, and so on. Isolation circuit 200 is connected to page buffers 300 by a plurality of bit lines BL1 through BL8.

Cell array 100 comprises several memory blocks. Each of the memory blocks comprises a plurality of cell strings connected to bit lines BLe1 through BLe8 and BLo1 through BLo8. Each of the cell strings comprises a string selection transistor, a ground selection transistor, and several memory cells. The string selection transistor, the memory cells, and the ground selection transistor are respectively connected to a string selection line, a plurality of word lines, and a ground selection line. In addition, the string selection line, the word lines, and the ground selection line are electrically connected to a row decoder (not shown).

During an erase operation of cell array 100, erase voltage Verase is applied to bit lines BLe1 through BLe8 and BLo1 through BLo8. Transistors in isolation circuit 200 have endurance to erase voltage Verase. However, transistors in page buffers 300 do not have endurance to erase voltage Verase because they use operating voltage Vcc.

As the degree of integration of the NAND flash memory device increases, respective distances between bit lines BLe1 through BLe8 and BLo1 through BLo8 become smaller and smaller. Accordingly, coupling capacitance between the bit lines increases. For example, where bit line BLo1 is charged with power voltage Vcc and bit line BLe1 is charged with 0V, coupling capacitance between bit line BLe1 and BLo1 may increase the voltage of bit line BLe1. As a result, a memory cell connected to bit line BLe1 may be erroneously programmed.

The problem of coupling capacitance between adjacent bit lines can be addressed by a bit line shield structure. In the bit line shield structure, one of bit lines BLe1 through BLe8 or bit lines BLo1 through BLo8 is selected during a read or program operation. Then, a read or program operation is performed on a memory cell connected to the selected bit line. Non-selected bit lines serve to isolate the selected bit lines to decrease the possibility of coupling capacitance between the selected bit lines.

Isolation circuit 200 is connected to bit lines BLe1 through BLe8 and BLo1 through BLo8 to prevent erase voltage Verase from being applied to bit lines BL1 through BL8. Isolation circuit 200 comprises high voltage transistors having an endurance to erase voltage Verase. All of the transistors in isolation circuit 200 are turned off during an erase operation. To turn off the transistors in isolation circuit 200, bit line selection signals BLSLTe and BLSLTo, which control respective gates of the transistors, are set to a logic level "low".

As mentioned previously, page buffers 300 are connected to bit lines BL1 through BL8. In particular, a first page buffer 310 is connected to bit line BL1, a second page buffer 320 is connected to bit line BL2, a third page buffer 330 is connected to bit line BL3, a fifth page buffer 350 is connected to bit line BL5, and so on.

The voltage level of bit line BL5 is greatly influenced by the voltage level of bit line BLo4 because bit lines BLo4 and BL5 run adjacent to each other over a significant portion of isolation circuit 200. Accordingly, where an erase voltage of about 20V is applied to bit line BLo4, the voltage level of bit line BL5 typically increases by about 7V due to coupling capacitance between bit lines BL04 and BL5. Where erase operations are repeatedly carried out using bit line BL04, transistors in fifth buffer 350 may break down due to the voltage caused by coupling capacitance. In general, the breakdown voltage for the transistors in page buffers 300 is about 6V.

Figure 3:
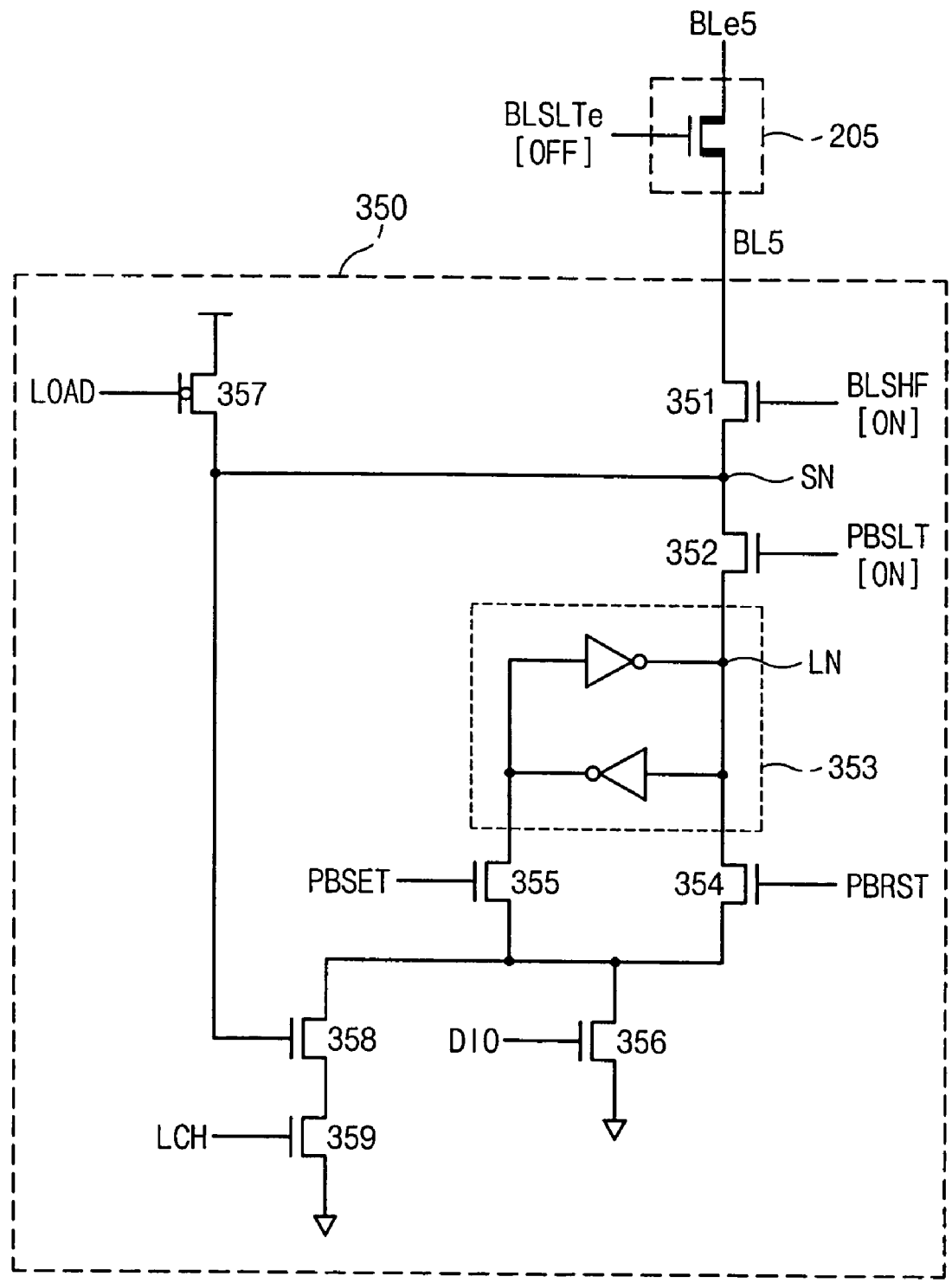
FIG. 3 is a circuit diagram of an isolation circuit and a page buffer shown in FIG. 2.

FIG. 3 is a circuit diagram of a portion of isolation circuit 200 and fifth page buffer 350. The portion isolation circuit 200 in FIG. 3 is a transistor 205 connected between bit line BLe5 and bit line BL5. Transistor 205 prevents an erase voltage applied to first bit line BLe5 from being applied to bit line BL5 to avoid damage to fifth page buffer 350.

Fifth page buffer 350 comprises bit line shut-off transistor 351 connected between bit line BL5 and a sensing node SN, a page buffer selection transistor 352 connected between sensing node SN and a latch node LN, a latch circuit 353 connected to latch node LN, and reset circuits 354 and 356 adapted to initialize latch node LN during an erase operation. Fifth page buffer 350 is adapted to discharge bit line voltage BL5 to protect shut-off transistor 351 from breaking down due to a coupling capacitance between bit lines BLo4 and BL5.

Fifth page buffer discharges bit line BL5 by connecting latch node LN to ground through reset circuits 354 and 356 during an erase operation and then turning on bit line shut-off transistor 351 and page buffer selection transistor 352.

Based on the foregoing description, a NAND flash memory device according to various embodiments of the present invention experiences an increase in bit line voltage BL5 due to a coupling capacitance between bit line BLo4 and bit line BL5. Fifth page buffer 350 discharges bit line voltage BL5 to prevent transistors contained therein from breaking down.

The foregoing preferred embodiments are teaching examples. Those of ordinary skill in the art will understand that various changes in form and details may be made to the exemplary embodiments without departing from the scope of the present invention as defined by the following claims.

What is claimed:

1. A NAND flash memory device, comprising:
   a first bit line connected to a memory cell array;
   an isolation circuit connected between the first bit line and a second bit line to prevent an erase voltage applied to the first bit line from being applied to the second bit line during an erase operation of the NAND flash memory device; and
   a page buffer connected to the second bit line and adapted to discharge the second bit line during the erase operation.

2. The NAND flash memory device of claim 1, wherein the isolation circuit comprises a high voltage transistor having endurance with respect to the erase voltage.

3. The NAND flash memory device of claim 2, wherein the high voltage transistor is turned off during the erase operation.

4. The NAND flash memory device of claim 1, wherein a voltage level of the second bit line increases due to a coupling capacitance during the erase operation.

5. The NAND flash memory device of claim 2, wherein the page buffer comprises:
   a first transistor connected between the second bit line and a sensing node;
   a second transistor connected between the sensing node and a latch node;
   a latch circuit connected to the latch node; and a reset circuit adapted to discharge the latch node.

6. The NAND flash memory device of claim 5, wherein the reset circuit comprises:
  third and fourth transistors connected in series between the latch node and ground.

7. The NAND flash memory device of claim 5, wherein the first transistor turns on during the erase operation.

8. The NAND flash memory device of claim 5, wherein the first and second transistors are turned on during the erase operation.

9. The NAND flash memory device of claim 5, wherein a voltage level of the second bit line increases due to a coupling capacitance during the erase operation.

10. A NAND flash memory device, comprising:
  a first bit line connected to a memory cell array;
  a second bit line arranged in parallel with the first bit line;
  a third bit line arranged in parallel with the first bit line;
  an isolation circuit connected between the first and third bit lines to prevent an erase voltage applied to the first bit line from being applied to the third bit line during an erase operation; and
  a page buffer connected to the second bit line and adapted to discharge the second bit line during the erase operation.

11. The NAND flash memory device of claim 10, wherein the isolation circuit comprises a transistor having an endurance with respect to the erase voltage.

12. The NAND flash memory device of claim 11, wherein the transistor is turned off during the erase operation.

13. The NAND flash memory device of claim 10, wherein a voltage level of the second bit line increases due to coupling capacitance between the first and second bit lines during the erase operation.

14. The NAND flash memory device of claim 10, wherein the page buffer comprises:
  a first transistor connected between the second bit line and a sensing node;
  a second transistor connected between the sensing node and a latch node;
  a latch circuit connected to the latch node; and
  a reset circuit adapted to discharge the latch node.

15. The NAND flash memory device of claim 14, wherein the reset circuit comprises:
  third and fourth transistors connected between the latch node and ground.

16. The NAND flash memory device of claim 14, wherein the first transistor is turned on during the erase operation.

17. The NAND flash memory device of claim 14, wherein the first and second transistors are turned on during the erase operation.

18. The NAND flash memory device of claim 14, wherein a voltage level of the second bit line increases due to a coupling capacitance between the first and second bit lines during the erase operation.

* * * * *